US009450045B1

United States Patent
Bobde et al.

(10) Patent No.: US 9,450,045 B1
(45) Date of Patent: Sep. 20, 2016

(54) METHOD FOR FORMING LATERAL SUPER-JUNCTION STRUCTURE

(71) Applicant: Alpha and Omega Semiconductor Incorporated, Sunnyvale, CA (US)

(72) Inventors: Madhur Bobde, Santa Clara, CA (US); Lingpeng Guan, San Jose, CA (US); Karthik Padmanabhan, San Jose, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/747,961

(22) Filed: Jun. 23, 2015

(51) Int. Cl.
| | |
|---|---|
| *H01L 21/00* | (2006.01) |
| *H01L 29/06* | (2006.01) |
| *H01L 29/78* | (2006.01) |
| *H01L 29/10* | (2006.01) |
| *H01L 21/265* | (2006.01) |
| *H01L 21/324* | (2006.01) |

(52) U.S. Cl.
CPC .......... *H01L 29/0634* (2013.01); *H01L 21/265* (2013.01); *H01L 21/324* (2013.01); *H01L 29/1095* (2013.01); *H01L 29/7823* (2013.01)

(58) Field of Classification Search
CPC .......... H01L 29/0634; H01L 29/7826; H01L 29/1095; H01L 29/7823
See application file for complete search history.

(56) References Cited

U.S. PATENT DOCUMENTS

| | | | |
|---|---|---|---|
| 6,097,063 A | 8/2000 | Fujihira | |
| 6,835,993 B2 | 12/2004 | Sridevan et al. | |
| 7,002,205 B2 | 2/2006 | Onishi et al. | |
| 7,772,668 B2 | 8/2010 | Pan | |
| 8,373,208 B2 | 2/2013 | Bobde et al. | |
| 8,558,275 B2 | 10/2013 | Bobde | |
| 8,575,695 B2 | 11/2013 | Bobde et al. | |
| 8,866,221 B2 | 10/2014 | Hirler et al. | |
| 2013/0140633 A1 | 6/2013 | Pattanayak | |
| 2014/0124851 A1* | 5/2014 | Gamerith | H01L 29/66712 257/329 |

OTHER PUBLICATIONS

Tatsuhiko Fujihira. "Theory of semiconductor superjunction devices." Japanese journal of applied physics 36.10R (1997): 6254.
Onishi, Y., et al. "SJ-FINFET: a new low voltage lateral superjunction MOSFET." Power Semiconductor Devices and IC's, 2008. ISPSD'08. 20th International Symposium on. IEEE, 2008.

* cited by examiner

*Primary Examiner* — Laura Menz
(74) *Attorney, Agent, or Firm* — Van Pelt, Yi & James LLP

(57) ABSTRACT

A fabrication method to form a lateral superjunction structure in a semiconductor device uses N and P type ion implantations into a base epitaxial layer. In some embodiments, the base epitaxial layer is an intrinsic epitaxial layer or a lightly doped epitaxial layer. The method performs simultaneous N and P type ion implantations into the base epitaxial layer. The epitaxial and implantation processes are repeated successively to form multiple implanted base epitaxial layers on a semiconductor base layer. After the desired number of implanted base epitaxial layers is formed, the semiconductor structure is subjected to annealing to form a lateral superjunction structure including alternate N and P type thin semiconductor regions. In particular, the alternating N and P type thin superjunction layers are formed by the ion implantation process and subsequent annealing. The fabrication method of the present invention ensures good charge control in the lateral superjunction structure.

12 Claims, 12 Drawing Sheets

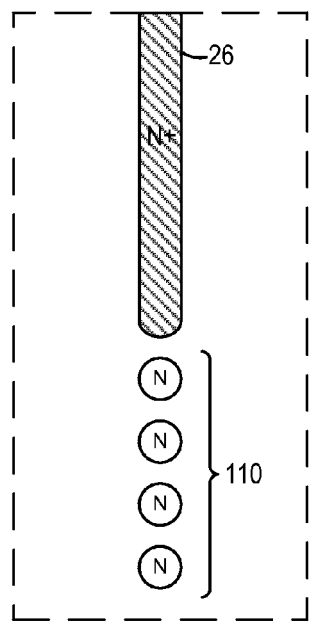 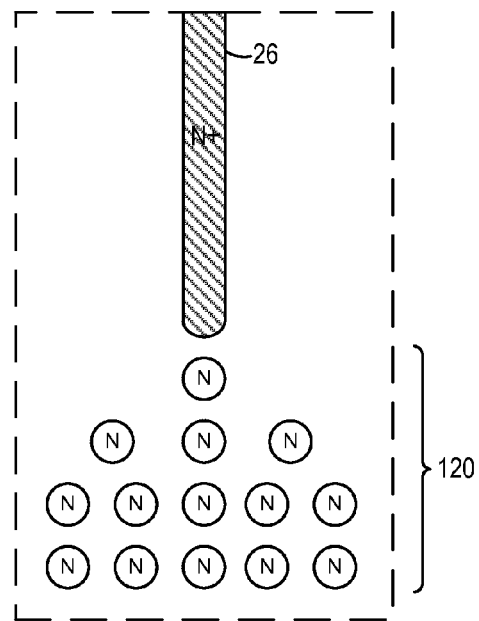
Fig. 8      Fig. 9
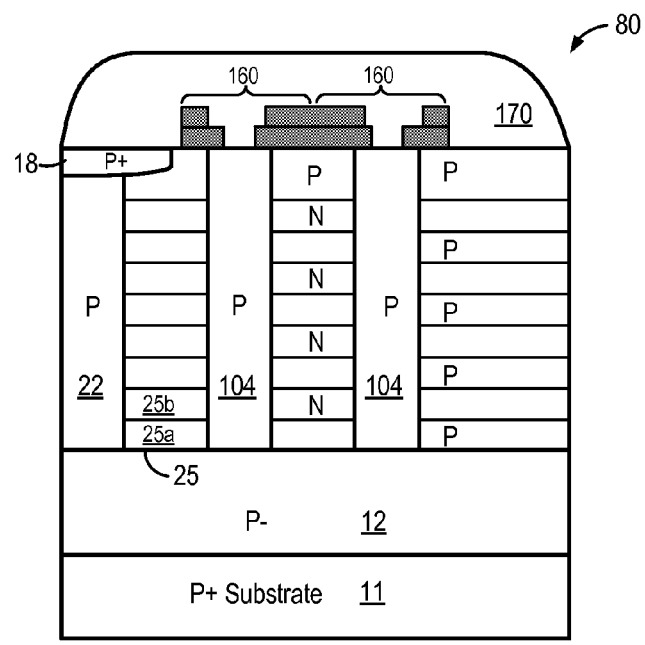
Fig. 10

METHOD FOR FORMING LATERAL SUPER-JUNCTION STRUCTURE

BACKGROUND OF THE INVENTION

Semiconductor devices incorporating superjunction structure to achieve improved electrical characteristics are known. For example, metal oxide semiconductor field effect transistor (MOSFET) devices can be incorporated with vertical or horizontal superjunction structure to optimize the on-resistance and the breakdown voltage characteristics of the transistor. As an example, Fujihira describes configurations of the lateral and vertical superjunction devices in the paper entitled "Theory of Semiconductor Superjunction Devices" (Japan Journal of Applied Physics Vol. 36, October 1997 PP 6254-6262). U.S. Pat. No. 6,097,063 also describes a vertical semiconductor device having a drift region in which a drift current flows if the drift region is in the ON mode and which is depleted if the drift region is in the OFF mode. The drift region is formed as a structure having a plurality of first conductive type divided drift regions and a plurality of second conductive type compartment regions in which each of the compartment regions is positioned among the adjacent drift regions in parallel to make p-n junctions, respectively.

Challenges remain in the design and manufacturing of superjunction semiconductor devices. These challenges include the difficulties in forming the superjunction structure, difficulties in improving manufacturability, and high product costs when epitaxial processes are used, among others. Furthermore, termination of the superjunction structure is important to ensure robust device operation.

BRIEF DESCRIPTION OF THE DRAWINGS

Various embodiments of the invention are disclosed in the following detailed description and the accompanying drawings.

FIGS. 8 and 9 illustrate alternate embodiments of the termination pillar structure as applied to an N+ doped region, such as a drain finger or a source finger, in a high voltage MOSFET device.

FIG. 10 is a cross-sectional view of the termination pillar structure in MOSFET device 80 of FIG. 7 along a line D-D' in embodiments of the present invention.

DETAILED DESCRIPTION

Figure 1:
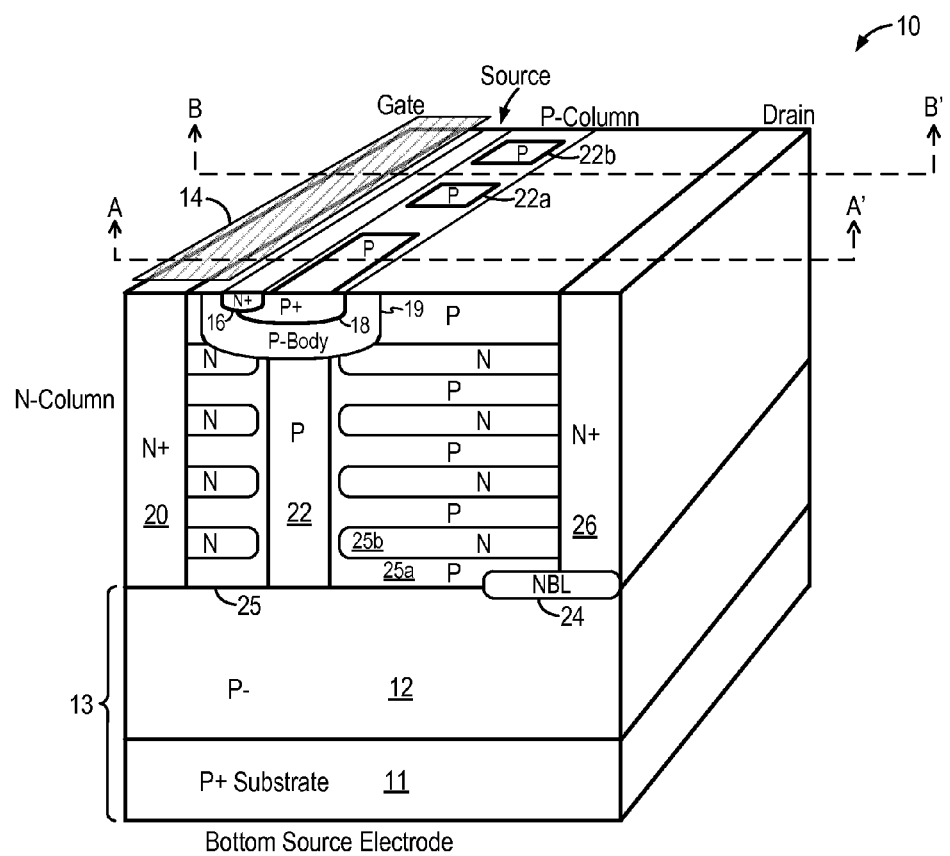
FIG. 1 is a perspective view of a lateral superjunction MOSFET device in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a lateral superjunction MOSFET device includes a MOS gate structure, an N-type column connected to the lateral superjunction structure and a P-type column disposed in close proximity to the N-type column. The MOS gate structure can be a low voltage gate structure, such as a planar gate configured to withstand only a portion of the voltage sustained by the MOSFET device. The lateral superjunction MOSFET device includes the N-type column to receive current from the channel when the MOSFET is turned on and to distribute the channel current to the N-type layers in the lateral superjunction structure. The channel current flows through the N-type superjunction layers and is collected by the drain terminal at the far end of the lateral superjunction structure. The P-type column disposed near the N-type column is used to pinch off the N-type column when the MOSFET device is to be turned off and to block the high voltage being sustained by the MOSFET device at the drain terminal from reaching the MOS gate. The P-type column can be connected to the source/body voltage of the MOSFET device.

In the present description, a superjunction structure refers to a semiconductor device structure including a thin semiconductor region of a first conductivity type functioning as a conduction channel of the semiconductor device and is bordered or sandwiched by thin semiconductor regions of a second, opposite conductivity type to form a balanced space charge region for enhancing the breakdown voltage characteristic of the semiconductor device. In some applications, the superjunction structure includes multiple thin semiconductor regions of alternating conductivity types formed laterally or vertically. That is, a superjunction structure includes alternating thin N-type semiconductor regions and thin P-type semiconductor regions that may be formed laterally or vertically. The multiple thin semiconductor regions of alternating N and P conductivity types are sometimes referred to herein as superjunction layers. In the present description, a lateral superjunction structure includes superjunction layers that extend substantially laterally in the semiconductor chip, that is, substantially in parallel with the major surfaces of the semiconductor chip. Accordingly, current flows in the lateral superjunction structure in a lateral direction through the superjunction layers or in parallel to the major surface of the semiconductor chip. On the other hand, a vertical superjunction structure includes superjunction layers that extend substantially vertically in the semiconductor chip, that is, substantially perpendicular with the major surfaces of the semiconductor chip. Accordingly, current flows in the vertical superjunction structure in a vertical direction through the superjunction layers or perpendicular to the semiconductor chip.

A salient feature of the lateral superjunction MOSFET device is that the surface gate or planar gate does not extend the entire depth of the lateral superjunction structure. Conventional superjunction MOSFET or JFET devices are formed using a trench gate that extends the entire depth of the superjunction structure. These conventional superjunction MOSFET or JFET devices thus suffer from high gate capacitance which limits the switching speed of the transistor device. In embodiments of the present invention, the lateral superjunction MOSFET device is formed using a surface planar gate to realize a small gate capacitance to ensure faster transistor switching speed.

The operation of the lateral superjunction MOSFET device of the present invention is as follows. When the MOSFET is turned on, a channel is formed in the body region under the low-voltage MOS gate and channel current flows from the source through the channel. The channel current feeds into the N-type column which distributes the current into the N-type superjunction layers connected thereto as the drain drift current. The drain drift current flows through the N-type superjunction layers to be collected by a drain terminal formed at the far end of the superjunction structure. When the MOSFET is turned on, the N-type column is therefore electrically connected to the drain with the drain being biased to a low drain voltage. When the MOSFET is turned off, the drain terminal is driven up to a large drain voltage (e.g. 600V). However, the P-column, connected to the source or body or the ground potential, pinches off the N-type column so that the N-type column floats and will not be driven up to the large drain bias voltage. In this manner, the P-column isolates the MOS gate from the high voltage sustained at the drain terminal while the transistor is turned off and a low voltage gate structure can be used. A low voltage MOS gate structure is desirable for lower gate capacitance and faster switching time.

According to other embodiments of the present invention, a lateral superjunction MOSFET device incorporates an edge termination structure for the lateral superjunction structure using N or P type termination columns or pillars. In other embodiments, the edge termination structure for the lateral superjunction structure further incorporates single or multi-step field plates to the N or P type termination pillars. In yet other embodiments, the edge termination structure for the lateral superjunction structure further includes a RESURF (Reduced Surface Field) shallow surface implant to reduce the surface field strength to achieve a breakdown voltage for the MOSFET device.

According to other embodiments of the present invention, a fabrication method to form a lateral superjunction structure in a semiconductor device uses N and P type ion implantations into a base epitaxial layer. In some embodiments, the base epitaxial layer is an intrinsic epitaxial layer or a lightly doped epitaxial layer. In some embodiments, the method performs simultaneous N and P type ion implantations into the base epitaxial layer. The epitaxial and implantation processes are repeated successively to form multiple implanted base epitaxial layers on a substrate. After the desired number of implanted base epitaxial layers is formed, the entire semiconductor structure is subjected to high temperature annealing. The difference in diffusion rates for the P type and the N type dopants is used to form a lateral superjunction structure including alternate N and P type thin semiconductor regions. In particular, the alternating N and P type thin superjunction layers are formed by the ion implantation process and subsequent annealing. The fabrication method of the present invention ensures good charge control in the lateral superjunction structure.

In particular, conventional fabrication methods for forming a lateral superjunction structure typically use successive epitaxial layers of alternating conductivity types. However, epitaxial processes typically have large variations in thickness and in doping concentration. As a result, a superjunction structure formed using thin epitaxial layers typically has poor charge control. That is, the desired layer thickness and dopant concentration for the thin semiconductor layers cannot be obtained. The fabrication method of the present invention uses dopant implantation into intrinsic or lightly doped epitaxial layers and annealing to form the superjunction structure. Implant processes give much better control over doping concentration than epitaxial processes. When intrinsic or lightly doped epitaxial layer is used as the base layer, the epitaxial doping and/or thickness variations have no effect on the charge balance of the superjunction structure. Instead, the charge balance of the superjunction structure is controlled by implant processes forming the N-type and P-type layers, which implant processes can be very tightly controlled. For example, implant processes can achieve doping and thickness variations of 2% or less typically. Such tight control over doping and thickness variations is not achievable by using epitaxial processes.

Lateral Super-Junction MOSFET Device

In embodiments of the present invention, a lateral superjunction MOSFET device uses a low voltage MOS gate structure. The lateral superjunction MOSFET device includes an N-type column connected to the lateral superjunction structure and a P-type column disposed in close proximity to the N-type column. The N-type column and the P-type column operate in conjunction to enable the MOSFET device to sustain a high voltage while isolating the low voltage MOS gate structure from the high voltage being sustained.

Figure 2:
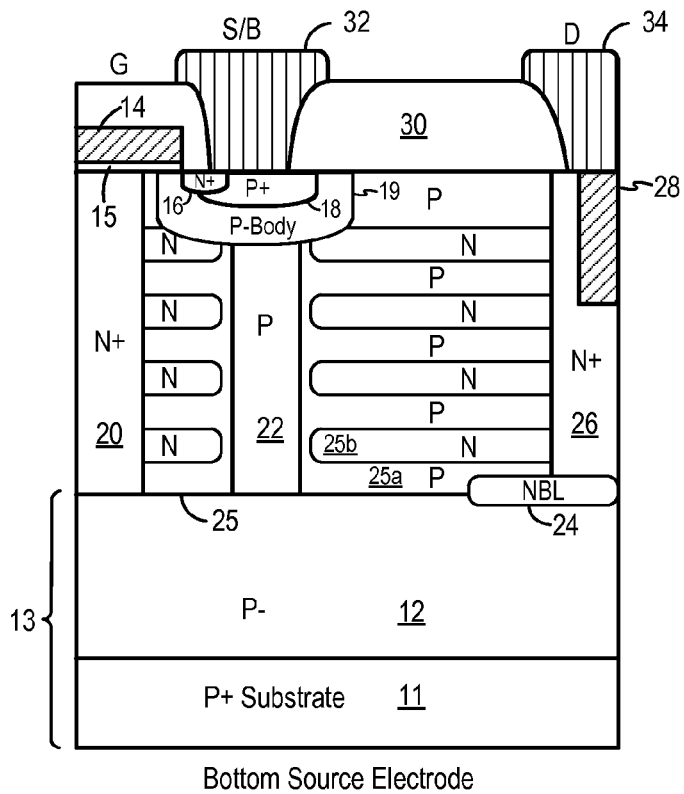
FIG. 2 is a cross-sectional view of the lateral superjunction MOSFET device of FIG. 1 along a line A-A' in embodiments of the present invention.
Figure 3:
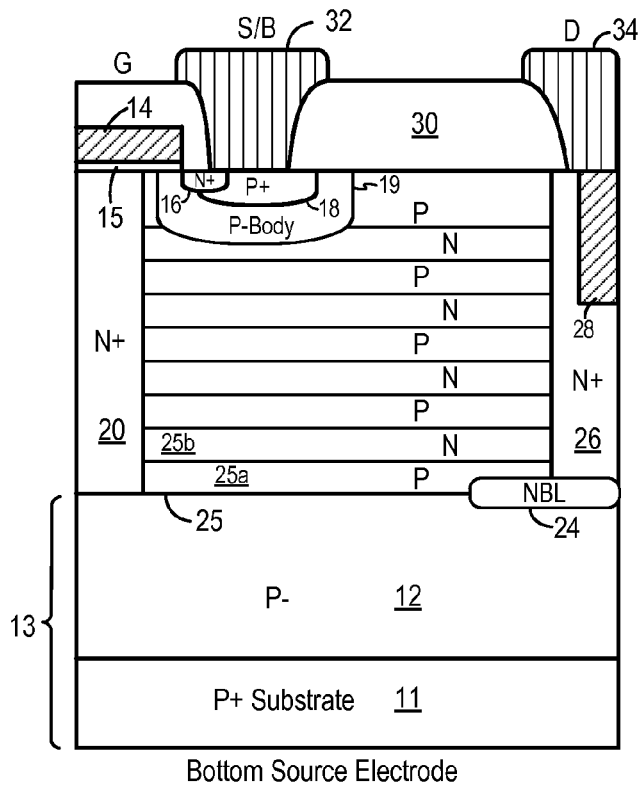
FIG. 3 is a cross-sectional view of the lateral superjunction MOSFET device of FIG. 1 along a line B-B' in embodiments of the present invention.

FIG. 1 is a perspective view of a lateral superjunction MOSFET device in embodiments of the present invention. FIG. 2 is a cross-sectional view of the lateral superjunction MOSFET device of FIG. 1 along a line A-A' in embodiments of the present invention. FIG. 3 is a cross-sectional view of the lateral superjunction MOSFET device of FIG. 1 along a line B-B' in embodiments of the present invention. Referring to FIGS. 1-3, a lateral superjunction MOSFET device 10 is formed on a heavily doped P-type substrate 11 ("P+ substrate"). A lightly doped P-type epitaxial layer 12 is formed on the P+ substrate 11. The P+ substrate 11 and the P-type epitaxial layer 12 form a P-type semiconductor base layer 13 on which the MOSFET device is formed. In the present description, the P-type semiconductor base layer 13 will be referred to as a "P– base layer." In the present embodiment, an N-type buried layer (NBL) 24 is formed on the P– base layer 13. The use of the lightly doped P-type epitaxial layer 12 and the N-type buried layer 24 has the effect of improving the breakdown sustainability of the MOSFET device, as will be explained in more detail below.

The lateral superjunction MOSFET device 10 includes a semiconductor body 25 with a lateral superjunction structure formed therein. More specifically, the semiconductor body 25 includes thin semiconductor regions of alternating N and P type conductivities. In particular, the semiconductor body 25 includes P-type thin semiconductor regions 25a and N-type thin semiconductor regions 25b that are formed alternately and extend substantially laterally in the semiconductor body. That is, the P-type thin semiconductor regions 25a and N-type thin semiconductor regions 25b, also referred herein as the superjunction layers, are formed substantially in parallel with the major surfaces of the semiconductor body 25. In the present description, the semiconductor body 25 is also referred to as the lateral superjunction structure 25.

To form the MOS transistor structure, the lateral superjunction MOSFET device 10 includes a low voltage gate structure formed on or in the semiconductor body 25 at a near end of the lateral superjunction structure. In the present embodiment, a planar gate structure is used as the low voltage gate structure. As shown in FIG. 1, a planar conductive gate 14 is formed on the top surface of the semiconductor body 25 and is insulated from the semiconductor body 25 by a thin gate dielectric layer 15. In some embodiments, the planar conductive gate 14 is a polysilicon gate and the gate dielectric layer 15 is a gate oxide layer. The lateral superjunction MOSFET device 10 further includes an N+ source region 16 formed in a P-type body region 19 ("P-body") and formed self-aligned to a first end of the conductive gate 14. As thus formed, the N+ source region 16 extends under the first end of the planar conductive gate 14, overlapping the conductive gate by a small amount. A P+ body contact region 18 is formed adjacent the N+ source region 16 and in the P-body region 19 for providing an ohmic contact to the P-body region of the MOSFET device. The gate 14 and the source 16 are formed at one end of the lateral superjunction structure 25. Meanwhile, an N+ drain region 26, formed as an N+ drain column, is formed at the distant end of the lateral superjunction structure 25 with the superjunction layers functioning as the drain drift region of the MOSFET device.

An insulating dielectric layer 30 is formed over the top surface of the semiconductor body 25 and openings in the dielectric layer 30 are made to form contacts to the source, body and drain of the MOSFET device 10. In the present embodiment, a contact opening is made to the N+ source 16 and the P+ body contact region 18 and a metal electrode 32 is formed in the contact opening as the source/body electrode. Another contact opening is made to the N+ drain region 26 and a metal electrode 34 is formed in the contact opening as the drain electrode. The heavily doped P+ substrate 11 forms a second source electrode of the MOSFET device, forming a bottom source electrode. The P+ substrate 11 provides a low inductance path to the ground terminal, which can improve the switching waveforms of the transistor significantly. The bottom source electrode also provides a path for avalanche current to flow directly to the ground terminal via the vertical diode formed by the N+ drain column 26 and the N-type buried layer (NBL) 24, to the P-type epitaxial layer 12 and the P+ substrate 11. In the present embodiment, to reduce the drain resistance, a doped polysilicon filled trench 28 is formed in the N+ drain column 26. The doped polysilicon filled trench 28 is optional and may be omitted in other embodiments of the present invention.

In lateral superjunction MOSFET device 10, the superjunction layers 25a, 25b function as the drain drift region of the MOSFET device with the thin semiconductor regions of one conductivity type functioning as the drain current paths to carry the drain drift current in the transistor On-state and the thin semiconductor regions of the other conductivity type functioning as a charge-balanced partition region to pinch off or deplete the drain current paths in the transistor Off-state. For the N-type MOSFET device 10, the N-type thin semiconductor regions 25b form the drain current paths to carry the drain current from the source region 16 to the drain region 26 while the P-type thin semiconductor regions 25a form the charge-balanced partition region which are depleted in the transistor off-state to deplete and pinch off the N-type thin semiconductor regions 25b.

In embodiments of the present invention, the lateral superjunction MOSFET device 10 includes an N-type column 20 disposed under the gate 14 and being spaced apart from the source region 16 with the separation between the source region 16 and the N-type column 20 being the channel region of MOSFET device. The N-type column 20 is electrically unbiased. The N-type column 20 extends in a vertical direction through the lateral superjunction structure 25. In some embodiments, the N-type column 20 is a heavily doped N+ region and is electrically connected to the drain column via the N-type superjunction layers at low drain bias conditions, when the MOSFET is turned on. However, the N-type column 20 is electrically floating at high drain bias conditions, when the MOSFET is turned off. In particular, at higher drain biases of 50V and above, the superjunction layers 25a and 25b will deplete out, thereby eliminating the connection between the N-type column 20 and the N+ drain column 26. In this manner, the N-type column 20 is isolated from the high drain voltage.

In embodiments of the present invention, the lateral superjunction MOSFET device 10 includes a P-type column 22 formed in spaced apart but in close proximity to the N-type column 20. The P-type column 22 is also referred to as the P-type blocking column. In the present embodiment, the P-type column 22 is formed in vertical alignment to the P+ body contact region 18 and is electrically connected to the P-body region 19 of the MOSFET device. Therefore, the P-type column 22 is biased to the same electrical potential as the body region of the MOSFET device. The P-type column 22 is not a continuous doped region through the width of the semiconductor body 25. Rather, the P-type column 22 can be formed as a single column or pillar occupying a portion of the semiconductor body 25 in the z-direction along the width of the superjunction structure, as shown in FIG. 1. Alternately, the P-type column 22 can be formed to include separate P-type columns or pillars, such as P-type columns 22a and 22b, disposed in the z-direction along the width of the superjunction structure, as shown in FIG. 1. Accordingly, while the P-type column 22 interrupts the drain current paths formed in the N-type thin semiconductor regions 25b in some locations (FIG. 2), the N-type thin semiconductor regions 25b remain contiguous and connected in other locations (FIG. 3) along the width of the superjunction structure.

As thus configured, the lateral superjunction MOSFET device 10 of the present invention is able to achieve a high breakdown voltage while optimizing the on-resistance of the transistor. The operation of the lateral superjunction MOSFET device 10 is as follows. The N+ source and P-body regions of the MOSFET device are connected to a ground potential or to a negative power supply potential. When the MOSFET device 10 is turned on by the application of a positive voltage to the gate 14 relative to the source region 16 that is greater than the threshold voltage of the transistor, a channel is formed in the P-body region 19 under the gate 14 between the source region 16 and the N-type column 20. The channel connects the N+ source region to the N-type column 20. When a positive voltage is applied to the drain electrode 34, current flows from the source region 16 to the drain region 26. In particular, a channel current flows from the source region 16 through the channel under the gate 14 and feeds into the N-type column 20. The N-type column 20 distributes the current into the N-type superjunction layers 25b connected thereto as the drain drift current. The drain drift current flows through the N-type superjunction layers 25b to be collected by the drain region 26 at the far end of the superjunction structure 25. In this manner, the lateral superjunction MOSFET device 10 is able to achieve a low on-resistance.

When the lateral superjunction MOSFET device 10 is turned off by the application of a voltage to the gate 14 less than the threshold voltage of the transistor device, the P-type column 22, biased to the body potential, is depleted and the depletion region extends to pinch off the N-type column 20. The superjunction layers 25a and 25b are also depleted completely to isolate the N-type column 20 from the N+ drain column 26. With the N-type column 20 thus isolated by the P-type column 22 and the superjunction layers, the N-type column 20 will not get driven up to the high drain voltage (e.g. 600V). In some embodiment, the N-type column is clamped at a voltage of 10V or below while the drain terminal sustains a large drain voltage (e.g. 600V) with the transistor being turned off.

In this manner, the P-type column 22 protects the MOS gate 14 from the high voltage sustained at the drain region 26 and a low voltage gate structure can be used in the MOSFET device 10. In particular, a low voltage MOS gate structure is desirable for lower gate capacitance and faster switching time. In some embodiments, the gate 14 of the MOSFET device 10 may be configured to sustain a low voltage of 20V while the drain may be configured to sustain a high voltage of 600V.

The lateral superjunction MOSFET device 10 thus formed is capable of sustaining a high breakdown voltage through the use of the lateral superjunction structure. Furthermore, in embodiments of the present invention, the lateral superjunction MOSFET device 10 includes the N-type buried layer 24 formed under the drain region 26. The N-type buried layer 24 further improves the vertical breakdown voltage of the MOSFET device.

Figure 4:
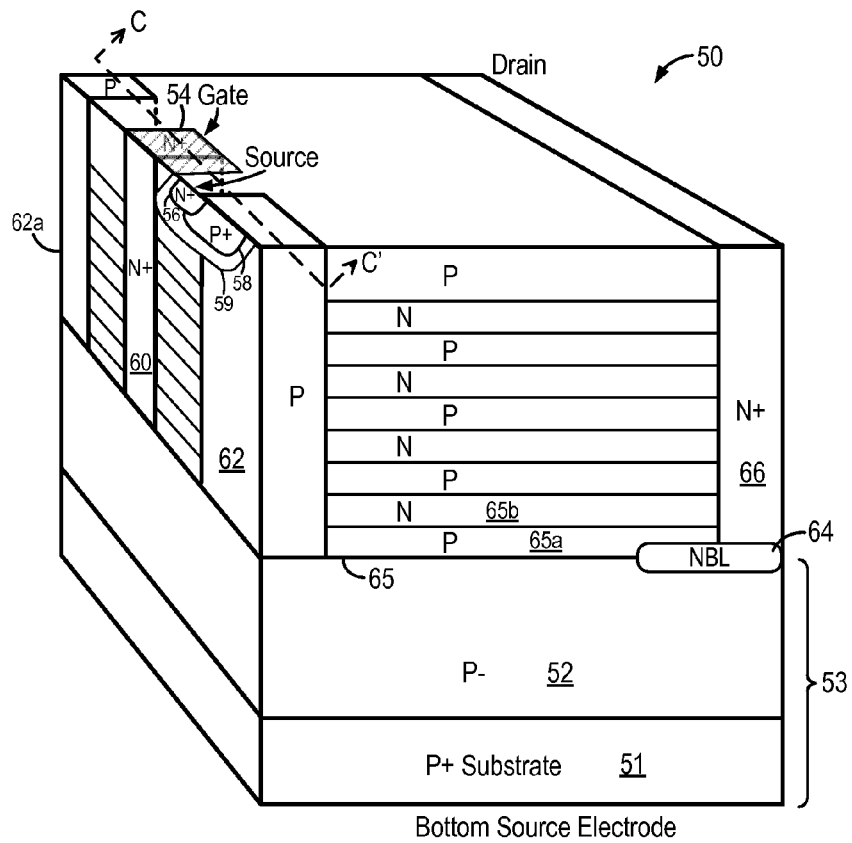
FIG. 4 is a perspective view of a lateral superjunction MOSFET device in alternate embodiments of the present invention.
Figure 5:
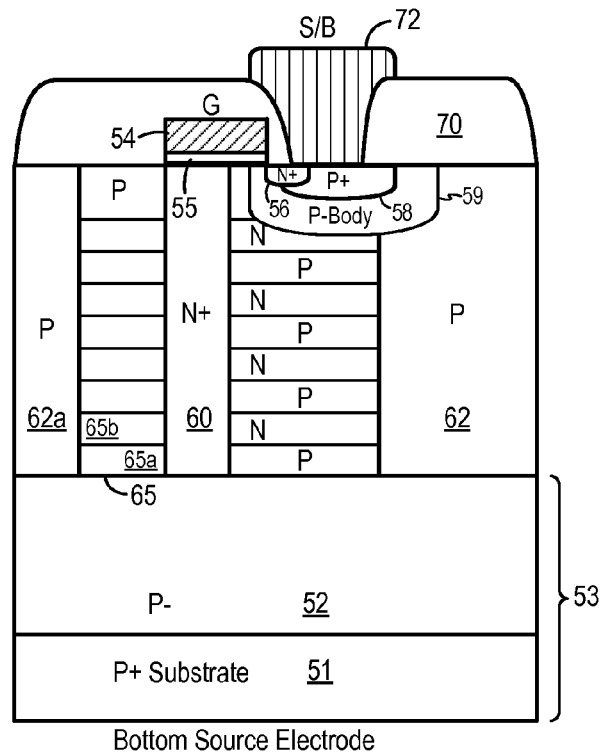
FIG. 5 is a cross-sectional view of the lateral superjunction MOSFET device of FIG. 4 along a line C-C' in embodiments of the present invention.

FIG. 4 is a perspective view of a lateral superjunction MOSFET device in alternate embodiments of the present invention. FIG. 5 is a cross-sectional view of the lateral superjunction MOSFET device of FIG. 4 along a line C-C' in embodiments of the present invention. Referring to FIGS. 4-5, a lateral superjunction MOSFET device 50 is constructed in the same manner as the lateral superjunction MOSFET device 10 of FIG. 1 except with the placement of the MOS gate structure and the N-type column. In particular, lateral superjunction MOSFET device 50 includes a lateral superjunction structure 65 formed on a lightly doped P-type epitaxial layer 52 formed on a P+ substrate 51. The lateral superjunction structure 65 functions as the drain drift region for the MOSFET device. An N+ drain region 66 is formed at a far end of the lateral superjunction structure 65. An N-type buried layer (NBL) 64 is formed under the N+ drain region 66 to enhance the breakdown voltage of the MOSFET device.

An insulating dielectric layer 70 is formed over the top surface of the semiconductor body 65 and openings in the dielectric layer 70 are made to form contacts to the source, body and drain of the MOSFET device 50. In FIG. 5, a contact opening is made to the N+ source 56 and the P+ body contact region 58 and a metal electrode 72 is formed in the contact opening as the source/body electrode.

In FIG. 1, the lateral superjunction MOSFET device 10 has the gate structure and the N-type column configured so that when the channel of the transistor is turned on, the channel current runs in a direction parallel to drain current paths formed by the superjunction layers. In the embodiment shown in FIG. 4, the lateral superjunction MOSFET device 50 has the gate structure 54 and the N-type column 60 configured so that when the channel of the transistor is turned on, the channel current runs in a direction perpendicular to the drain current paths formed by the superjunction layers. More specifically, the current flowing from the source region 56, through the channel under the gate 54 is collected by the N-type column 60 which distributes the current to the N-type superjunction layers 65b. The drain drift current from the N-type column 60 and flowing through the drain drift region formed by the lateral superjunction structure 65 travels in a perpendicular direction to the channel current. The drain drift current is then collected by the N+ drain electrode 66 at the other end of the lateral superjunction structure 65.

In the embodiment shown in FIGS. 4 and 5, the gate 54 of the MOSFET device 50 and the N+ column 60 are flanked by P-type columns 62 and 62a. P-type columns 62 and 62a are formed in spaced apart but in close proximity to the N-type column 50. In the present embodiment, the P-type column 62 is formed in contact with the P+ body contact region 58 and is electrically connected to the P-body region 59 of the MOSFET device. Therefore, the P-type column 62 is biased to the same electrical potential as the body region of the MOSFET device 50. In the present embodiment, N+ column 60 is flanked by the P-type column on both sides. In other embodiments, only one P-type column, such as P-type column 62 may be used. The P-type columns 62, 62a operates to pinch off the N+ column 60 when the MOSFET device 50 is to be turned off to isolate the gate 54 of the transistor from the high voltage that may be sustained at the drain terminal of the transistor.

FIGS. 1-5 illustrate two different configurations of the low voltage MOS gate structure, the N-type column and the P-type column. One of ordinary skilled in the art would appreciate that the exact configurations of the low voltage MOS gate structure, the N-type column and the P-type column in the MOSFET device described above are illustrative only and not intended to be limiting. Other configurations of the low voltage MOS gate structure, the N-type column and the P-type column may be used in the lateral superjunction MOSFET device of the present invention as long as the N-type column is used to distribute the current from the channel of the transistor to the lateral superjunction structure when the transistor is turned on and the P-type column functions to deplete and pinch off the N-type column as well as isolating the low voltage MOS gate when the transistor is turned off.

Termination Structures

In the lateral superjunction MOSFET device described above, edge termination techniques are employed to manage the high electrical field that may develop at the end or the termination of the drain and/or source regions of the MOSFET device.

Figure 6:
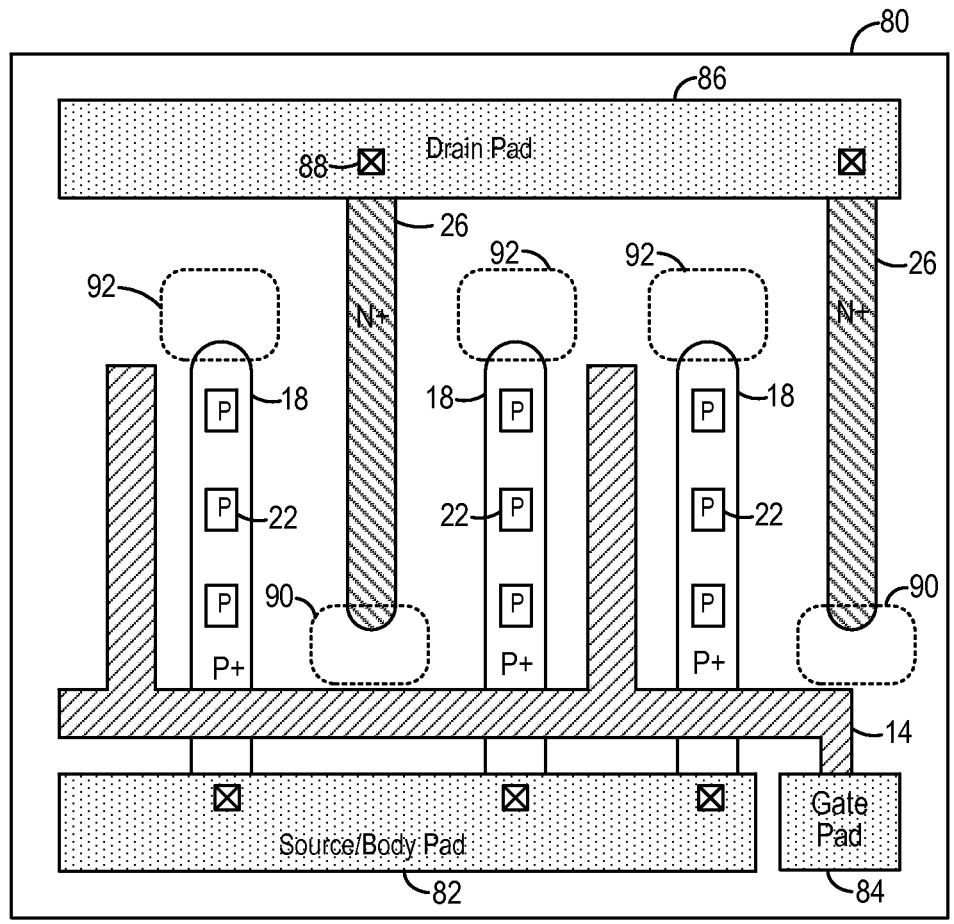
FIG. 6 is a top view of the high voltage MOSFET device formed using lateral superjunction MOSFET cell in embodiments of the present invention.

FIG. 6 is a top view of the high voltage MOSFET device formed using lateral superjunction MOSFET cell in embodiments of the present invention. In embodiments of the present invention, the lateral superjunction MOSFET device described above in FIGS. 1-5 may be used as a basic MOSFET cell where the MOSFET cell is duplicated to form an array of MOSFET devices where the MOSFET cells are connected in parallel to form a high voltage MOSFET device. In some embodiments, the basic MOSFET cell may be repeated to form MOSFET cells connected in parallel to realize a high voltage MOSFET integrated circuit. FIG. 6 illustrates a portion of a high voltage MOSFET device 80 where the MOSFET device 10 of FIG. 1 is used as the basic MOSFET cell that is duplicated and mirrored to form an array of parallelly connected MOSFET devices. As thus configured, the N+ drain regions 26 of the MOSFET cells extend from the drain pad 86 into the active cell area and P+ body contact region 18 extends from the source/body pad 82 into the active cell area. P-type columns 22 may be formed in alignment with the P+ body contact region 18. The polysilicon gate 14 is formed above the body region and the N+ column (not shown) and is connected to a gate pad 84. The source region is formed adjacent the gate 14 and is not shown in FIG. 6 for simplicity.

As thus configured, the N+ drain regions 26 form long fingers ("drain fingers") in the MOSFET device 80. The ends of the drain fingers form termination regions 90 which may experience concentrated electrical field due to the geometry of the drain fingers. Similarly, the P+ body contact regions 18 form long fingers ("body contact fingers") in the MOSFET device 80. The ends of the body region fingers form termination regions 92 which may experience concentrated electric field due to the geometry of the body region fingers.

Figure 7:
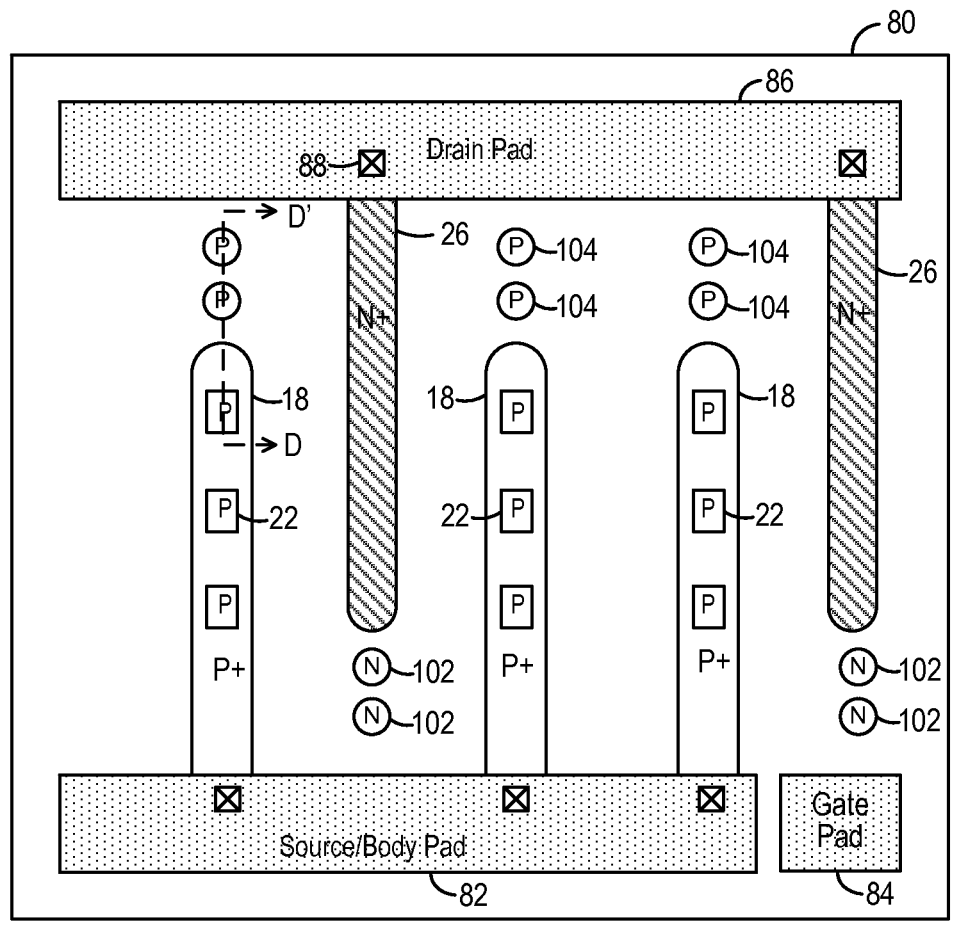
FIG. 7 is a top view of the lateral superjunction MOSFET device of FIG. 6 incorporating a termination pillar structure in embodiments of the present invention.

In embodiments of the present invention, a termination structure for a lateral superjunction MOSFET device uses N-type or P-type termination columns or pillars at the termination regions of respective N+ or P+ doped regions. In particular, N-type or P-type termination pillars or columns are vertical doped regions formed in the semiconductor body that extends into the semiconductor body to a depth similar to the depth of the N+ or P+ doped regions to be protected. In some embodiments, the termination pillars or columns are electrically floating, that is, not electrically connected to a specific potential. In other embodiments, the termination pillars may be biased to a given voltage from the surrounding doped region the pillars are in physical contact with. For example, in some embodiments, the P-type termination pillars may be weakly connected to the source potential and the N-type termination pillars may be weakly connected to the drain potential at zero drain bias. However, once the drain bias is sufficient to pinch-off the superjunction layers, the N-type termination pillars will float, and shape the termination electric field by reaching intermediate electric potential. FIG. 7 is a top view of the lateral superjunction MOSFET device of FIG. 6 incorporating a termination pillar structure in embodiments of the present invention. In FIG. 7, the gate layer 14 is omitted to simplify the drawing and to better illustrate the termination structure of the present invention. Referring to FIG. 7, the termination structure includes N-type termination pillars 102 formed in the termination regions of the N+ drain fingers 26. Meanwhile, P-type termination pillars 104 are formed in the termination regions of P+ body contact fingers 18. The termination pillars 102 and 104 improve the breakdown characteristics of the MOSFET integrated circuit 100.

In embodiments of the present invention, the number and positioning of the termination pillars are selected to optimize the breakdown characteristics of the MOSFET device. In the embodiment shown in FIG. 7, a pair of linearly aligned termination pillars is used in the termination region of each doped region finger. The number and arrangement of the termination pillar structure in FIG. 7 are illustrative only and not intended to be limiting. In other embodiments, one or more pillar pillars may be used. Furthermore, a given pattern or arrangement of the pillar pillars may be used to optimize the breakdown characteristics of the MOSFET device. FIGS. 8 and 9 illustrate alternate embodiments of the termination pillar structure as applied to an N+ doped region, such as a drain finger or a body finger, in a high voltage MOSFET device. Referring to FIG. 8, a termination structure 110 for an N+ drain finger 26 includes a linear series of four N-type termination pillars arranged in the termination region of the N+ drain finger 26. Referring to FIG. 9, a termination structure 120 for an N+ drain finger 26 includes a two-dimensional arrangement of N-type termination pillars in the termination region of the N+ drain finger 26. The exact number and arrangement of the termination pillars in the termination region are not critical to the practice of the present invention.

FIG. 10 is a cross-sectional view of the termination pillar structure in MOSFET device 80 of FIG. 7 along a line D-D' in embodiments of the present invention. Referring to FIG. 10, P-type termination pillars 104 are formed in the termination region of the body contact finger 18. The P-type termination pillars 104 are formed in the semiconductor body 25 with the lateral superjunction structure formed therein. Furthermore, the P-type termination pillars 104 extend through the semiconductor body 25 to the P-type epitaxial layer 12. In some embodiments, the P-type termination pillars 104 are formed in the same manner as the P-type column 22.

Furthermore, in embodiments of the present invention, the termination structure for the lateral superjunction MOSFET device may further include a field plate formed on the top surface of the semiconductor body 25 and surrounding the termination pillars 104 to shape the surface electric field to further enhance the breakdown characteristics. Referring to FIG. 10, a field plate structure 160 is formed on the top surface of the semiconductor body 25 and surrounding each P-type termination pillar 104. In the present embodiment, a multi-step field plate is used. In other embodiments, single or multi-step field plate may be used to shape the surface electric field of the termination pillars. In some embodiments, the field plate is formed using a polysilicon or metal layer. Furthermore, a multi-step field plate may be formed using polysilicon or metal with an overlying silicon oxide or silicon nitride layer to form a multi-step field plate structure.

Figure 11:
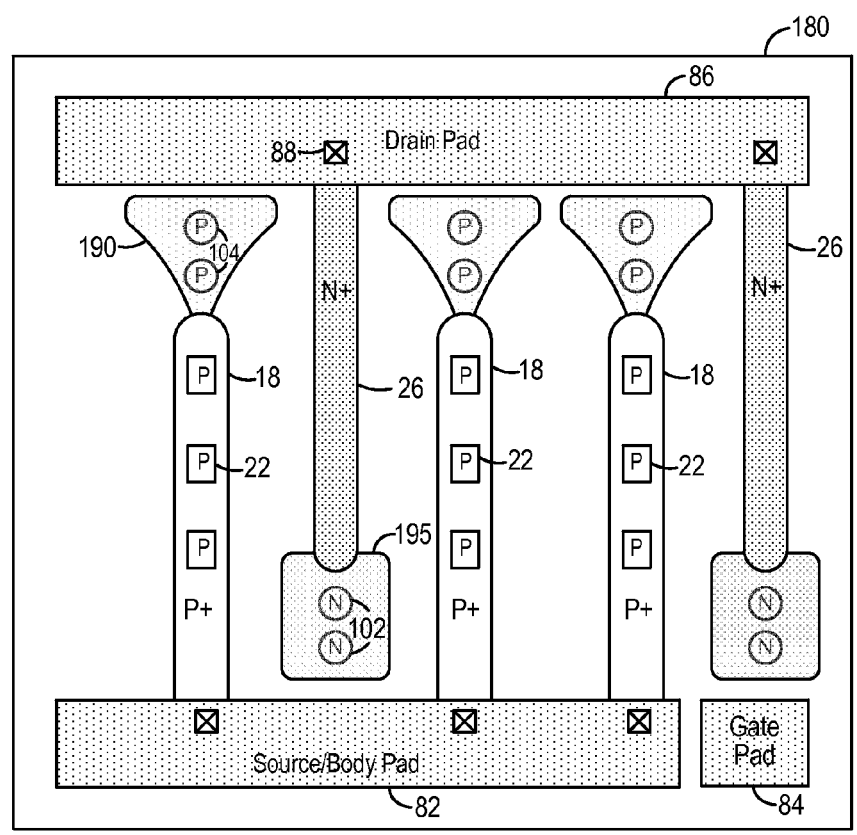
FIG. 11 is a top view of is a top view of the lateral superjunction MOSFET device of FIG. 7 incorporating a termination pillar structure with RESURF surface implant in embodiments of the present invention.

In embodiments of the present invention, the termination structure for the lateral superjunction MOSFET device may further include a reduced surface field (RESURF) surface implant. A RESURF surface implant is a shallow implant at the surface of the semiconductor body in the termination region to shape the surface electric field and reduce the surface field strength. FIG. 11 is a top view of is a top view of the lateral superjunction MOSFET device of FIG. 7 incorporating a termination pillar structure with RESURF surface implant in embodiments of the present invention. Referring to FIG. 11, a P-type RESURF surface implant region 190 is formed in the termination region of the body contact finger 18 while an N-type RESURF surface implant region 195 is formed in the termination region of drain finger 26. The RESURF surface implant can be used in addition to the termination pillars to form a more rugged termination structure.

Furthermore, in embodiments of the present invention, the shape of the RESURF surface implant region 190, 195 can be adapted to optimize the field shaping effect. In the present illustration, the P-type RESURF surface implant region 190 is formed in a triangular shape while the N-type RESURF surface implant region 195 is formed in rectangular shape. Other shapes for the RESURF surface implant region can be used in other embodiments of the present invention to shape the surface electric field based on the electric field profile.

Method to Form Lateral Superjunction Structure

Conventional fabrication methods for forming a lateral superjunction structure typically use successive epitaxial layers of alternating conductivity types to form the thin N and P type semiconductor layers. However, epitaxial processes are typically associated with large variations in thickness and in doping concentration. For example, the thickness variation of an epitaxial process can have a variation of +/−5%. As a result, a superjunction structure formed using thin epitaxial layers typically has poor charge control. That is, the desired layer thickness and dopant concentration for the thin semiconductor layers cannot be obtained. Therefore, lateral superjunction structures formed using N and P type epitaxial layers cannot achieve the desired level of charge balancing required for optimal operation.

In embodiments of the present invention, a fabrication method to form a lateral superjunction structure in a semiconductor device uses N and P type ion implantations into a base epitaxial layer. In some embodiments, the method performs simultaneous N and P type ion implantations into a base epitaxial layer. In some embodiments, the base epitaxial layer is an intrinsic epitaxial layer or a lightly doped epitaxial layer. The epitaxial and implantation processes are repeated successively to form multiple implanted base epitaxial layers on a substrate. After the desired number of implanted base epitaxial layers are formed, the entire semiconductor structure is subjected to high temperature anneal. Difference in the diffusion rates of the P type and N type dopants is used to separate out the P and N type dopants and to form lateral superjunction structure including alternate N and P type thin semiconductor regions. In particular, the alternating N and P type thin superjunction layers are formed by the ion implantation process and subsequent annealing. By the use of ion implantation to form the N and P type superjunction layers, the fabrication method of the present invention ensures good charge control in the lateral superjunction structure. More specifically, ion implantation processes give better control in doping concentration and doping profile and can therefore ensure tight doping concentration distribution in the lateral superjunction structure thus formed.

The fabrication method of the present invention uses ion implantation into intrinsic or lightly doped epitaxial layers and annealing to form the lateral superjunction structure. Ion implantation processes give much better control over doping concentration than epitaxial processes. When intrinsic or lightly doped epitaxial layer is used as the base layer, the epitaxial doping and/or thickness variations have no effect on the charge balance of the lateral superjunction structure. Instead, the charge balance of the superjunction structure is controlled by ion implantation processes forming the N-type and P-type layers, where the ion implantation processes can be very tightly controlled. For example, implant processes can achieve doping and thickness variations of 2% or less typically. Such tight control over doping and thickness variations is not achievable by using epitaxial processes alone to form the N and P type thin semiconductor layers.

Figure 12A:
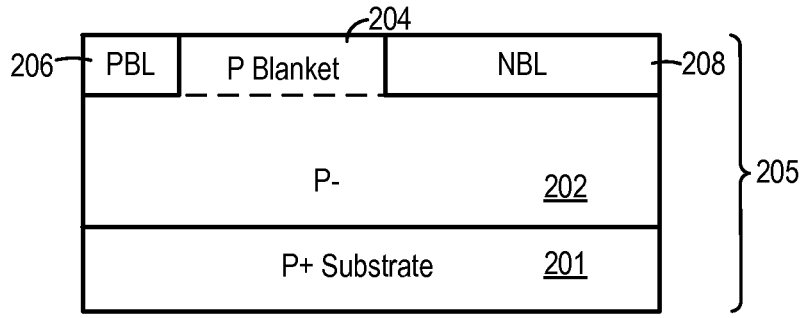
FIGS. 12A to 12J are cross-sectional view showing the processing steps to form a lateral superjunction structure using the ion implantation fabrication method in embodiments of the present invention.

FIGS. 12A to 12J are cross-sectional view showing the processing steps to form a lateral superjunction structure using the ion implantation fabrication method in embodiments of the present invention. Referring to FIG. 12A, the fabrication process starts with a heavily doped P-type semiconductor substrate 201. A lightly doped P-type epitaxial layer 202 is grown on the heavily doped P+ substrate 201. The P+ substrate 201 and the P-type epitaxial layer 202 form a semiconductor base layer 205 on which the lateral superjunction structure is to be formed. In other embodiments, a lightly doped N-type (N−) silicon substrate can be used.

A blanket P-type ion implantation is performed to form a blanket P layer 204 on the semiconductor base layer 205. The blanket P-type ion implantation may be performed after a pad oxide layer is formed on the top surface of the epitaxial layer 202. Then, a patterned N-type implantation process is carried out to form an N-buried layer 208 and a patterned P-type implantation process is carried out to form a P-buried layer 206.

Figure 12B:
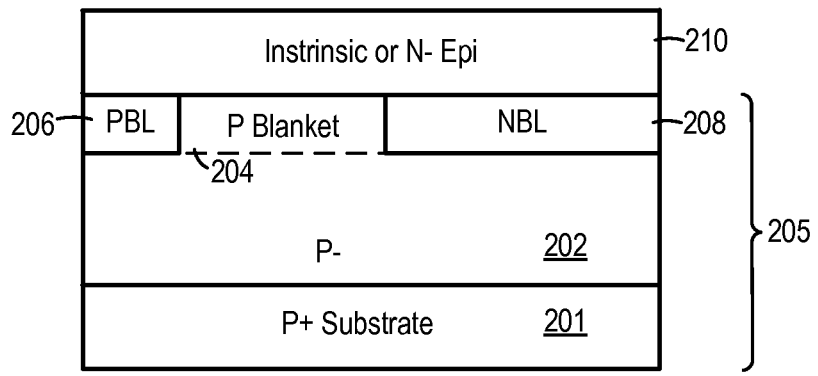

With the semiconductor base layer 205 thus formed, the process for forming the lateral superjunction structure can begin. Referring to FIG. 12B, a base epitaxial layer 210 is formed on the semiconductor base layer 205. In some embodiments, the base epitaxial layer 210 is an intrinsic layer. In other embodiments, the base epitaxial layer is a lightly doped layer, such as a lightly doped N− epitaxial layer or a lightly doped P− epitaxial layer. Then, referring to FIG. 12C, N and P ion implantation is performed to implant N and P type dopants into the base epitaxial layer 210. In some embodiments, the N and P type dopants are implanted simultaneously and implanted at the same or substantially the same depth.

Figure 12C:
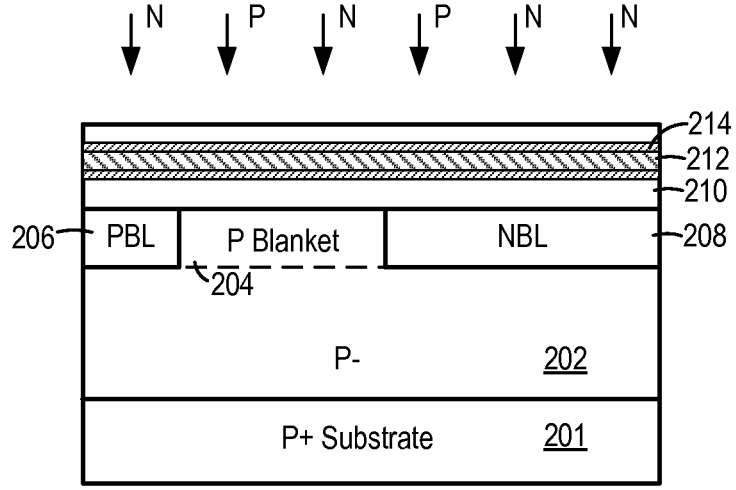
Figure 12D:
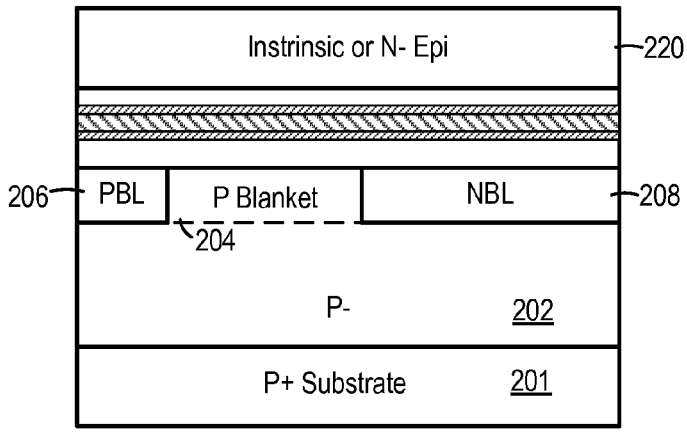
Figure 12E:
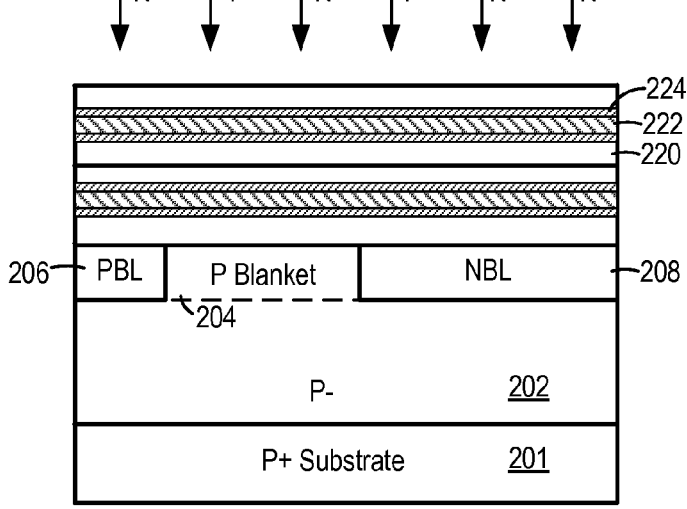

As a result of the implantation process, N type dopants 212 and P type dopants 214 are implanted in the base epitaxial layer 210. The implanted dopants have not yet been activated and the implanted base epitaxial layer 210 contains the implanted dopants remaining at more or less the implant site. A subsequent anneal process will be carried out to activate the implanted dopants at which point the implanted dopants will spread to form the alternating N and P thin semiconductor regions, as will be explained in more detail below The epitaxial and ion implantation process of FIGS. 12B and 12C is repeated to form the desired number of lateral superjunction layers. Referring to FIG. 12D, a second base epitaxial layer 220 is formed on the first base epitaxial layer 210. The second base epitaxial layer 220 may be intrinsic or lightly N-type doped. Then, referring to FIG. 12E, N and P ion implantation is performed to implant N and P type dopants into the base epitaxial layer 220.

Figure 12F:
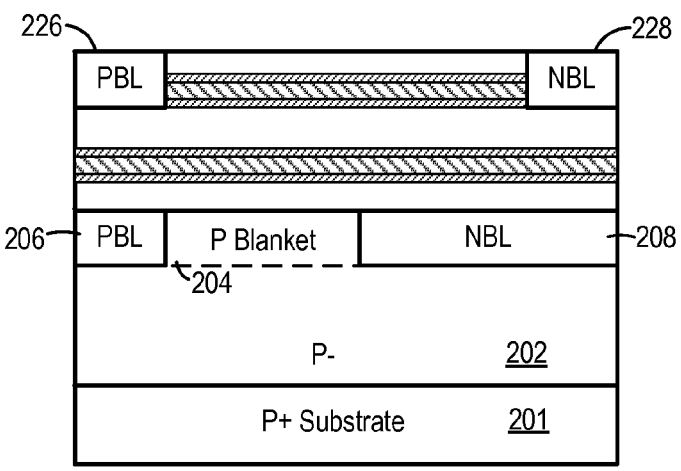

In the present embodiment, additional processing steps are also performed to form a P-type column to be used for channel blocking and an N+ column to be used as the drain region. Referring to FIG. 12F, a P-type buried layer implant 226 is performed at a location vertically aligned with the P-buried layer 206 previously formed in the semiconductor base layer 205. Furthermore, an N-type buried layer implant 228 is performed at a location vertically aligned with the N-buried layer 208 previously formed in the semiconductor base layer 205. Then, the epitaxial and ion implantation process of FIGS. 12B and 12C is repeated again to form another set of superjunction layers. After annealing, the P-buried layers will merge to form a P-type column. And the N-buried layers will merge to form an N-type column.

Alternately, the P-type column can be formed by using a deep trench etch and P+ polysilicon fill after the epitaxial growth process.

Figure 12G:
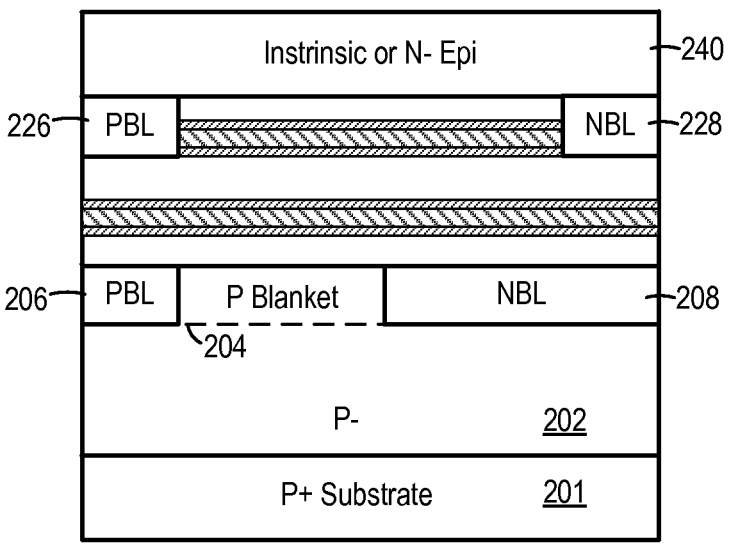
Figure 12H:
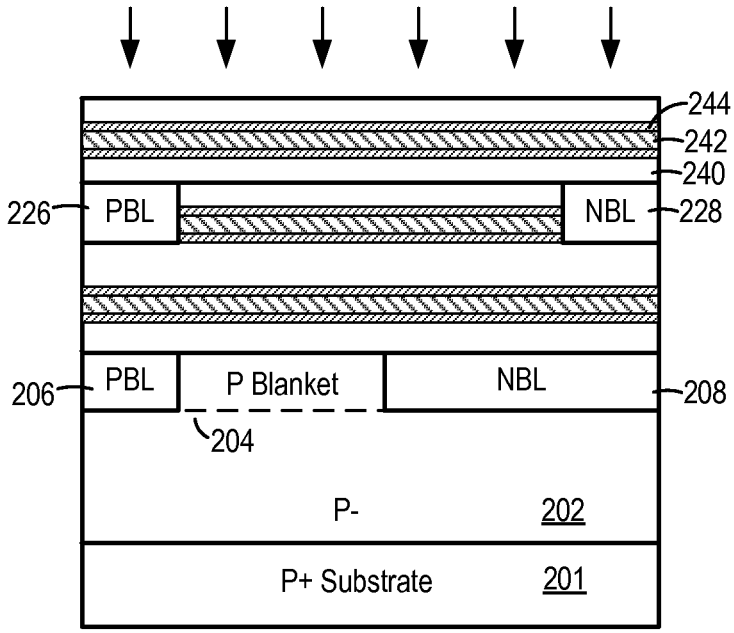

Referring to FIG. 12G, a third base epitaxial layer 240 is formed on the second base epitaxial layer 220. The third base epitaxial layer 240 may be intrinsic or lightly N-type doped. Then, referring to FIG. 12H, N and P ion implantation is performed to implant N and P type dopants into the base epitaxial layer 240. In the present example, it is assumed that only three layers of implanted base epitaxial layers are needed. Then, referring to FIG. 12I, a cap epitaxial layer 250 is formed on the third or last base epitaxial layer. The cap epitaxial layer 250 can be intrinsic or lightly N-doped.

In embodiments of the present invention, the first base epitaxial layer 210 has a thickness of about 5 µm and the subsequent base epitaxial layers 220, 240 have a thickness of about 2 µm. The cap epitaxial layer 250 has a thickness of about 3 µm.

Figure 12I:
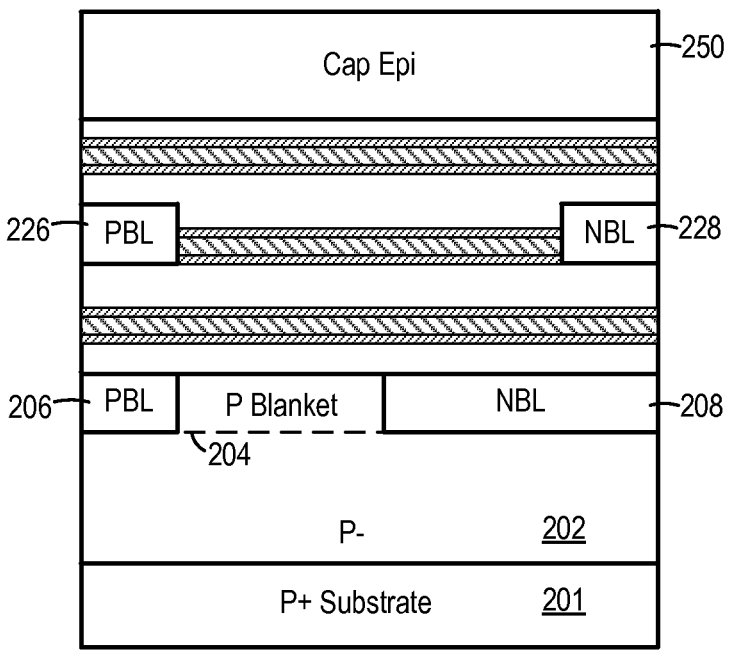
Figure 12J:
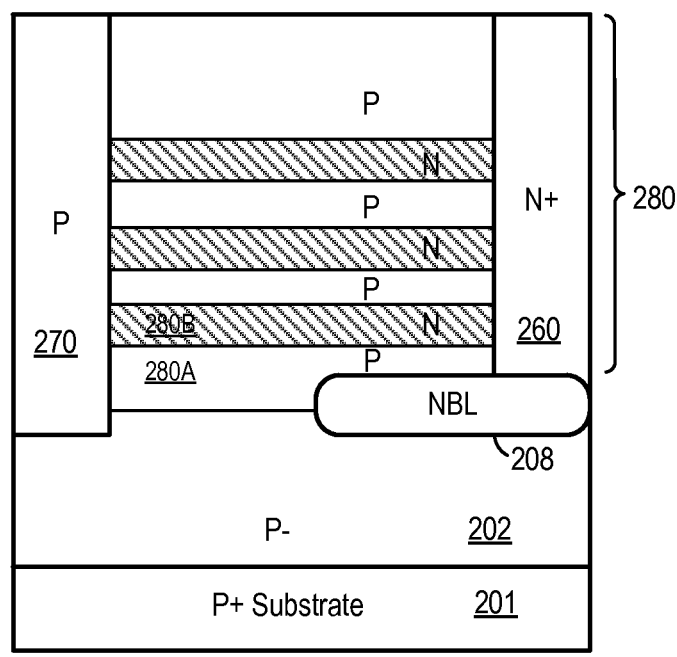

After the final epitaxial and implantation process, the entire semiconductor structure of FIG. 12I is subjected to high temperature anneal. For example, the semiconductor structure may be annealed at 1150° C. for 200 minutes. The annealing process activates and spread out the implanted dopants to form the desired alternating N and P type thin semiconductor regions, as shown in FIG. 12J. After annealing, the N-type dopants spread to form the N-type superjunction layers 280B and the P-type dopants spread to form the P-type superjunction layers 280A. A lateral superjunction structure 280 is thus formed. Meanwhile, the P-type buried layer 226 and 206 are also annealed and spread to form a contiguous P-type column 270. The N-type buried layer 208 and 228 are also annealed and spread to form a contiguous N-type column 260.

In embodiments of the present invention, the N and P type ion implantation is performed using arsenic or antimony as the N-type dopants and boron as the P-type dopants. By using a heavier N-type dopant as compared to the P-type dopant, the N-type implanted dopants do not spread out far from the implanted site during annealing. Meanwhile, by using a lighter P-type dopant, the P-type implanted dopants spread out from the implanted site farther during annealing to form a P-type layer with uniform doping concentration. Furthermore, in embodiments of the present invention, the simultaneous N and P type ion implantation is performed using a higher N-type implant dose than the P-type implant dose to ensure that the N-type doping concentration does not get washed out by the P-type dopants during the annealing process. In some embodiment, the N-type implant dose is three times the P-type implant dose. In this manner, alternating N and P-type thin semiconductor regions are formed by annealing the N and P implanted dopants formed in the multiple base epitaxial layers.

It is instructive to note that the processing steps of the N-type and P-type buried layers are described to illustrate the formation of the vertical doped regions in the lateral superjunction structure and are not critical to the practice of the present invention. Other methods for forming the vertical doped regions can be used in other embodiments of the present invention.

Figure 13A:
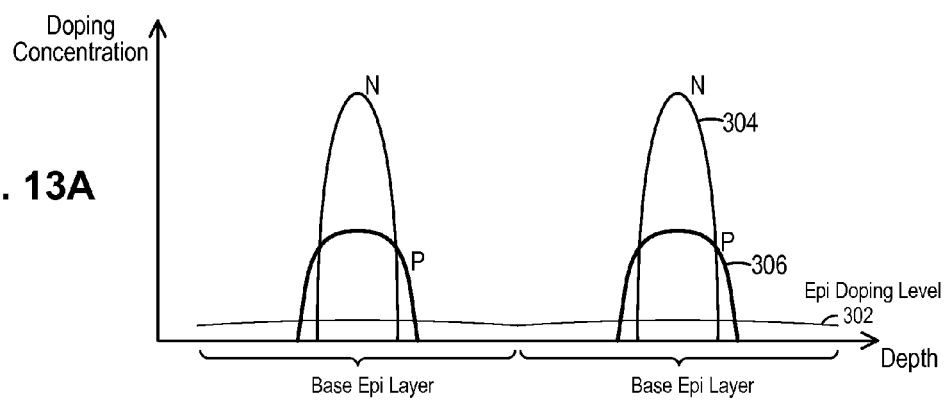
FIGS. 13A and 13B illustrate the doping profiles in the lateral superjunction structure fabrication method of the present invention before and after annealing in embodiments of the present invention.
Figure 13B:
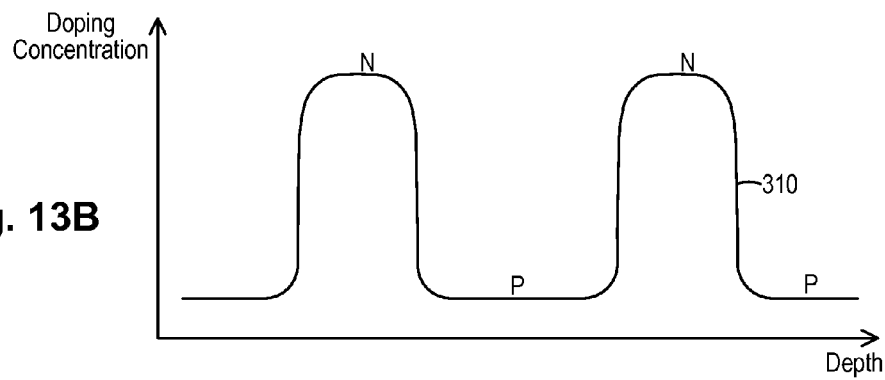

FIGS. 13A and 13B illustrate the doping profiles in the lateral superjunction structure fabrication method of the present invention before and after annealing in embodiments of the present invention. Referring to FIG. 13A which illustrates the doping profiles after all implantation processes but before the annealing operation, the base epitaxial layer has an epitaxial doping level represented by curve 302. The simultaneous N and P type implants are performed to the same depth in each base epitaxial layer. The N-type dopant (curve 304) has a higher implant dose than the P-type dopant (curve 306). Furthermore, the P-type dopant is lighter than the N-type dopant and therefore, the implant profile of the P-type dopant is wider than the N-type dopant.

FIG. 13B illustrates the doping profiles after the annealing operation. The annealing process activates and spread out the implanted dopants. The N-type dopant does not spread as much as P-type and remains mostly around the implanted site. Meanwhile, after annealing, the P-type implanted dopants spread out to cover the base epitaxial layer to form a substantially blanket P-type layer. The N-type implant has a high doping concentration and therefore the N-type doping concentration is not washed out by the P-type dopants. In this manner, alternating N and P layers are formed in the base epitaxial layers as shown by curve 310.

In the above described embodiments, an N-type MOSFET device is described. It is understood that a P-type lateral superjunction MOSFET device can be constructed in a similar manner by reversing the polarities of the doped regions.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for forming a lateral superjunction structure, comprising:
   providing a heavily doped semiconductor substrate of a first conductivity type;
   forming a lightly doped semiconductor layer of the first conductivity type on the substrate, the substrate and the lightly doped semiconductor layer forming a semiconductor base layer;
   forming a base epitaxial layer on the semiconductor base layer;
   performing N-type and P-type implantation into a first region of the base epitaxial layer to introduce both N-type and P-type dopants into the first region of the base epitaxial layer;
   repeating the forming a base epitaxial layer and the performing N-type and P-type implantation into the base epitaxial to form a plurality of implanted base epitaxial layers on the semiconductor base layer, the plurality of implanted base epitaxial layers forming a semiconductor structure having a first surface opposite the semiconductor base layer; and
   annealing the plurality of implanted base epitaxial layers to activate implanted dopants and to spread out the implanted dopants to form alternating N-type and P-type thin semiconductor regions in the semiconductor structure, wherein the alternating N-type and P-type thin semiconductor regions form the lateral superjunction structure, the alternating N-type and P-type thin semiconductor regions being formed in the first region and being formed parallel to the first surface of the semiconductor structure.

2. The method of claim 1, further comprising:
   forming a cap epitaxial layer on the last implanted base epitaxial layer.

3. The method of claim 2, wherein forming a cap epitaxial layer on the last implanted base epitaxial layer comprises:
   forming an intrinsic epitaxial layer as the cap epitaxial layer.

4. The method of claim 2, wherein forming a cap epitaxial layer on the last implanted base epitaxial layer comprises:
   forming a lightly doped epitaxial layer of N or P type conductivity as the cap epitaxial layer.

5. The method of claim 1, wherein forming a base epitaxial layer on the semiconductor base layer comprises:
   forming an intrinsic epitaxial layer as the base epitaxial layer on the semiconductor base layer.

6. The method of claim 1, wherein forming a base epitaxial layer on the semiconductor base layer comprises:
   forming a lightly doped epitaxial layer of the N or P type conductivity as the base epitaxial layer on the semiconductor base layer.

7. The method of claim 1, wherein performing N-type and P-type implantation into the first region of the base epitaxial layer comprises:
   performing simultaneous N-type and P-type implantation into the first region and the same depth in the base epitaxial layer.

8. The method of claim 1, wherein performing N-type and P-type implantation into the first region of the base epitaxial layer comprises:
   performing N-type and P-type implantation into the first region of the base epitaxial layer using an N-type implant dose much greater than a P-type implant dose.

9. The method of claim 8, wherein performing N-type and P-type implantation into the first region of the base epitaxial layer using an N-type implant dose much greater than a P-type implant dose comprises:
   performing N-type and P-type implantation into the first region of the base epitaxial layer using an N-type implant dose at least three times greater than the P-type implant dose.

10. The method of claim 1, wherein performing N-type and P-type implantation into the first region of the base epitaxial layer comprises:
    performing N-type and P-type implantation using N-type dopants that are much heavier than the P-type dopants.

11. The method of claim 10, wherein performing N-type and P-type implantation using N-type dopants that are much heavier than the P-type dopants comprises:
    performing N-type and P-type implantation using arsenic or antimony as N-type dopants and using boron as P-type dopants.

12. The method of claim 1, forming comprising:
    forming a P-type buried region and an N-type buried region in the semiconductor base layer; and
    forming a P-type buried region and an N-type buried region in one or more base epitaxial layers,
    wherein annealing the plurality of implanted base epitaxial layers to activate implanted dopants and to spread out the implanted dopants comprises annealing the plurality of implanted base epitaxial layers to form a P-type vertical doped region from the P-type buried regions and an N-type vertical doped region from the N-type buried regions, the P-type and N-type vertical doped regions being formed perpendicular to the first surface of the semiconductor structure.

* * * * *